(12) United States Patent
Tarng (10) Patent No.: US 9,081,053 B2
(45) Date of Patent: Jul. 14, 2015

(54) USING CONTINUOUS SWEEP FREQUENCIES IN A SYSTEM FREQUENCY RESPONSE TEST

(75) Inventor: Tony Jawhorng Tarng, Bethlehem, PA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 652 days.

(21) Appl. No.: 12/956,372

(22) Filed: Nov. 30, 2010

(65) Prior Publication Data

US 2012/0136600 A1 May 31, 2012

(51) Int. Cl.
G01R 31/28 (2006.01)

(52) U.S. Cl.
CPC ........ *G01R 31/2837* (2013.01); *G01R 31/2839* (2013.01)

(58) Field of Classification Search
USPC ......... 702/69, 75–77, 85, 106, 108, 126, 189, 702/190, 191
See application file for complete search history.

(56) References Cited

U.S. PATENT DOCUMENTS

| | | | |
|---|---|---|---|
| 4,244,037 A * | 1/1981 | Jelks | 367/121 |
| 4,652,816 A | 3/1987 | Crookshanks | |
| 5,177,709 A * | 1/1993 | Baziw | 367/38 |
| 5,591,913 A | 1/1997 | Tucker | |
| 6,236,371 B1 | 5/2001 | Beck | |
| 7,428,683 B2 | 9/2008 | Dai et al. | |
| 2006/0020865 A1 | 1/2006 | Dai et al. | |
| 2006/0198471 A1* | 9/2006 | Kirkby | 375/343 |
| 2008/0040078 A1* | 2/2008 | Taenzer et al. | 702/190 |
| 2010/0312515 A1* | 12/2010 | Miyasaka | 702/106 |

* cited by examiner

*Primary Examiner* — Mohamed Charioui

(74) *Attorney, Agent, or Firm* — Alan A. R. Cooper; Frank D. Cimino (57) ABSTRACT

A system and method for measuring the frequency response of a system under test using a single swept-frequency chirp signal. A tapered chirp-frequency test signal is created with a bandwidth defined by first and second frequencies. The test signal is routed to a calibration path, and the output of the calibration path is routed to a digitizer. The output of the calibration path is digitized, and a Fourier transform of the calibration path output is generated. The test signal is then routed to a test system, and the output of the test system is coupled to the digitizer. The output of the test system is digitized, and a Fourier transform of the test system output is generated. A normalized frequency-domain representation of the test system created by dividing the Fourier transform of the test system output by the Fourier transform of the calibration path output.

22 Claims, 9 Drawing Sheets

USING CONTINUOUS SWEEP FREQUENCIES IN A SYSTEM FREQUENCY RESPONSE TEST

TECHNICAL FIELD

Embodiments of the invention are directed, in general, to testing the frequency response of hardware systems, and, more specifically, to using a continuously swept input signal to provide an accurate analysis of the system under test.

BACKGROUND

Testing a filter's frequency response can be a time-consuming task particularly when a broad range of frequencies are tested in the filter. In known systems, a sine wave generator is connected to a filter under test and generates single tone (i.e. single frequency) test signals. Output signals are captured while test signals at different frequencies are injected into the filter one at a time by the sine wave generator. The frequency response of the filter can be measured after a sufficient number of different frequency signals have been input and the associated output signals captured. When multiple filters must be tested over a broad frequency range, such as in a production-test environment, excessive test time may be required to cycle through multiple test signals at different frequencies for each filter.

In addition to requiring a long test time, the use of individual test frequencies may prevent the accurate characterization of a filter's frequency response. Typically, the frequencies corresponding to points in a filter's response that are 3 dB lower than the pass band are used to measure the filter's bandwidth. Because the actual 3 dB points are not known in production filters, the frequencies selected for the input sine wave are unlikely provide a measurement at the exact 3 dB points. It is likely that the test signals will be input at frequencies that bracket above and below the 3 dB point, which would allow the tester to interpolate the 3 dB point, but would not provide a precise measurement or identification of the 3 dB point. In some filters, such as a notice filter or in a filter with a very narrow pass band, the response in the notch or pass band may be missed by the test equipment if the step size of the input test tones is too big, which would result in an incorrect characterization of the filter's pass band. The existing solutions capture only one frequency at a time and step through a finite set of frequencies to cover the entire band. Many fractional frequencies that appear between the test frequencies cannot be tested. The test times for existing systems are very long and provide only a few data points. As a result, existing test systems provide poor resolution in filter frequency bandwidth testing.

SUMMARY

Embodiments of the invention allow for shorter test time and improve the resolution available from filter frequency bandwidth testing. A continuous sweep frequency signal is used as the input test signal. The output signal is digitized and the frequency response is calculated with fast fourier transform (FFT). A bypass route provides a calibration factor. The test data may be divided by the calibration factor to eliminate test system effects and to obtain the true system response. The solution disclosed herein requires only one output signal capture and covers the entire frequency band continuously without missing any fractional frequency between test frequencies. Additionally, the test time is only a fraction of existing systems and provides significantly more data points compared to previous methods.

BRIEF DESCRIPTION OF THE DRAWINGS

Having thus described the invention in general terms, reference will now be made to the accompanying drawings, wherein:

DETAILED DESCRIPTION

The invention now will be described more fully hereinafter with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. One skilled in the art may be able to use the various embodiments of the invention.

Figure 1:
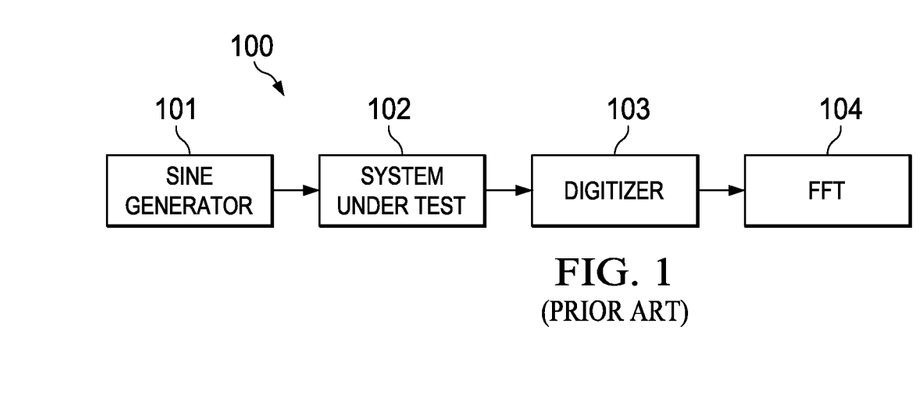
FIG. 1 is a block diagram illustrating a conventional single-tone test system.

FIG. 1 is a block diagram illustrating a conventional single-tone test system 100. Sine generator 101 is coupled to the input of system under test 102, which may be a filter, for example. The output of system under test 102 is captured and digitized by digitizer 103 and then passed to Fast Fourier Transform (FFT) circuit 104, which calculates the Discrete Fourier Transform (DFT) of the captured output signal. In system 100, digitizer 103 makes one capture per frequency from sine generator 101, and FFT circuit 104 generates one DFT data point for each captured signal. Only one of the DFT data points are of interest in all FFT data, which is not an efficient utilization of time. System 100 may be difficult to use for testing narrow band filters, such as band pass or band reject filters, due to the practical trade off between a long test time and low data points. The more data points required to measure the response of a narrow band filter, the longer the test will take. Additionally, it may be difficult for sine generator 101 to create fractional frequencies to accurately measure points of interest, such as the 3 db points.

Figure 2:
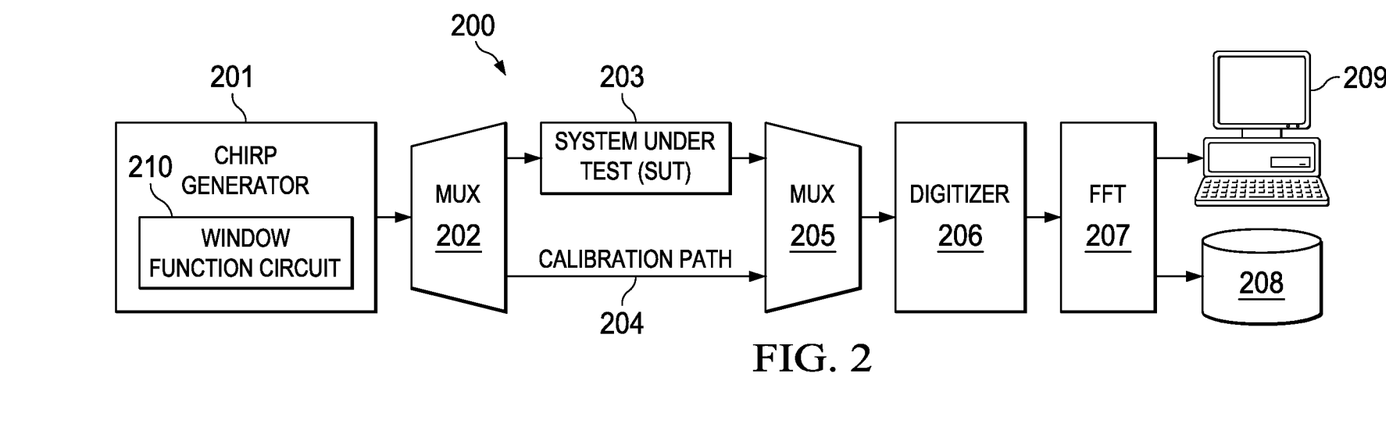
FIG. 2 is a block diagram illustrating a chirp-frequency test system according to one embodiment.

FIG. 2 is a block diagram illustrating a chirp-frequency test system 200 according to one embodiment. Sine generator 201 is coupled to multiplexer (MUX) 202 which allows for selection of a signal path either through system under test 203, which may be a filter, for example, or through calibration path 204. The outputs of system under test 203 and calibration path 204 are received at multiplexer 205 and routed for capture and digitization by digitizer 206 and then passed to FFT circuit 207, which calculates the Discrete Fourier Transform (DFT) of the captured output signal. The data points output from FFT 207 may be stored in memory 208 and/or displayed on display 209.

System 200 allows for a single capture and FFT of all data points. In embodiments of system 200, four thousand data points are achievable in the same time required for a single tone test of just one data point in system 100. Additional data points are captured in system 200 with minimal impact on the total test time. System 200 also provides an optimal test bed for narrow band filters because it tests the full spectrum.

Calibration path 204 is used to identify losses created by the test hardware and software. After these losses are identified, they can be used to compensate for hardware and software effects in the measurements of the system under test 203. In one embodiment, data is first passed through calibration path 204 from chirp generator 201. The output of the calibration path 204 is captured as the baseline. Then, system under test 203 is switched into the signal path and input signal data from chirp generator 201 is applied. The output data is captured from the system under test 203 and is divided by the calibration data to get the true system response for system under test 203.

The input test signal used in one embodiment is a linear sweep signal, such as defined in Equation 1. This input signal may be a chirp waveform, such as waveform 300 illustrated in FIG. 3, which may be generated in by linear frequency modulated source. The swept signal undergoes a continuous change over a defined range from a low frequency to a high frequency.

$$s(t) = w(t)\sin\left(f_1 t + \frac{1}{2T}(f_2 - f_1)t^2\right) \quad 0 \le t \le T \quad \text{Eq. 1}$$

where:
s(t)=output waveform;
w(t)=windowing function;
$f_1$=initial frequency;
$f_2$=final frequency; and
T=total sweep time.

Figure 3:
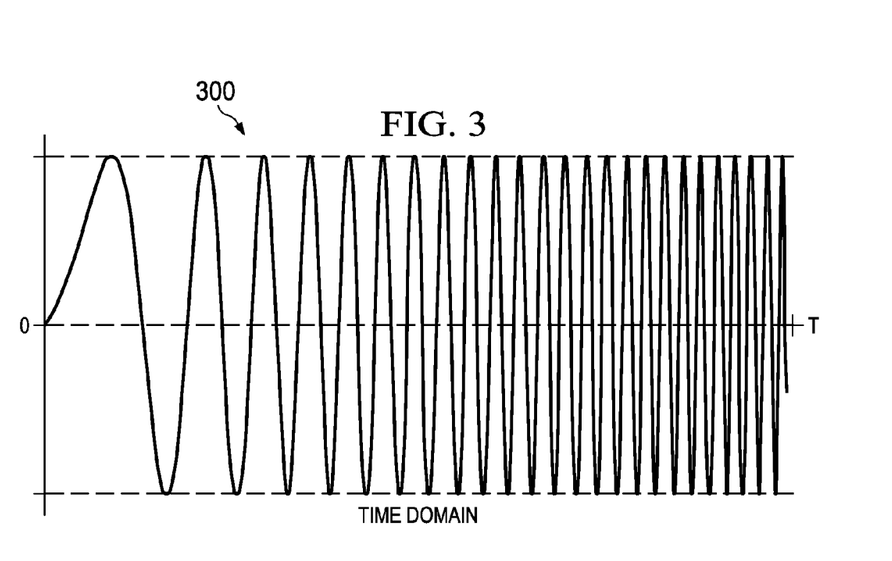
FIG. 3 illustrates a chirp waveform input signal that may be generated in by linear frequency modulated source.

The instantaneous frequency of waveform 300 at any given time between 0 and T is given by Equation 2.

$$f_I(t) = \left(1 - \frac{t}{T}\right)f_1 + \frac{t}{T}f_2. \quad \text{Eq. 2}$$

Figure 4:
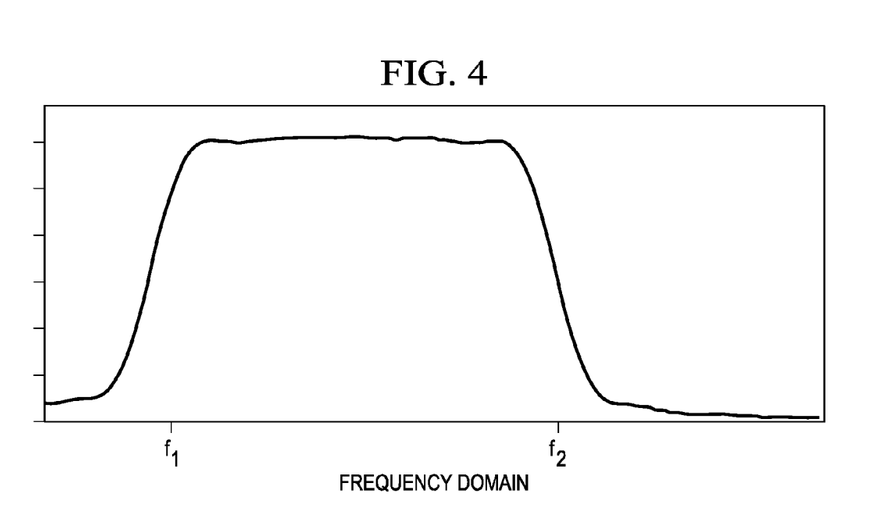
FIG. 4 illustrates the frequency domain representation of the chirp waveform signal of FIG. 3.

FIG. 4 illustrates signal 300 in the frequency domain. As shown in FIG. 4, the swept input test signal 300 spans the entire frequency range from $f_1$ to $f_2$.

Figure 5:
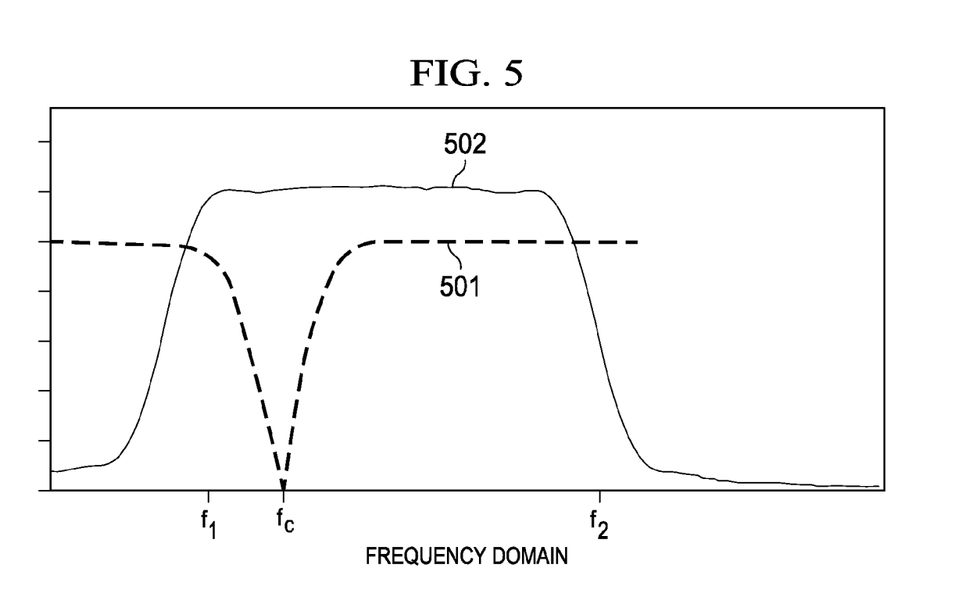
FIG. 5 illustrates an expected frequency response for a system under test.

FIG. 5 illustrates an expected frequency response 501 for a system under test, such as a notch filter having a center frequency $f_c$. The frequency band 502 of the test signal, such as the signal generated by chirp generator 201, can be selected by adjusting start and end frequencies $f_1$ and $f_2$ so that center frequency $f_c$ falls within the range of tested frequencies. The frequencies $f_1$ and $f_2$ can be adjusted to cover any frequency of interest for the system under test. Once the frequencies $f_1$ and $f_2$ are determined, then the system under test can be analyzed using one input signal that sweeps the entire band.

Figure 6:
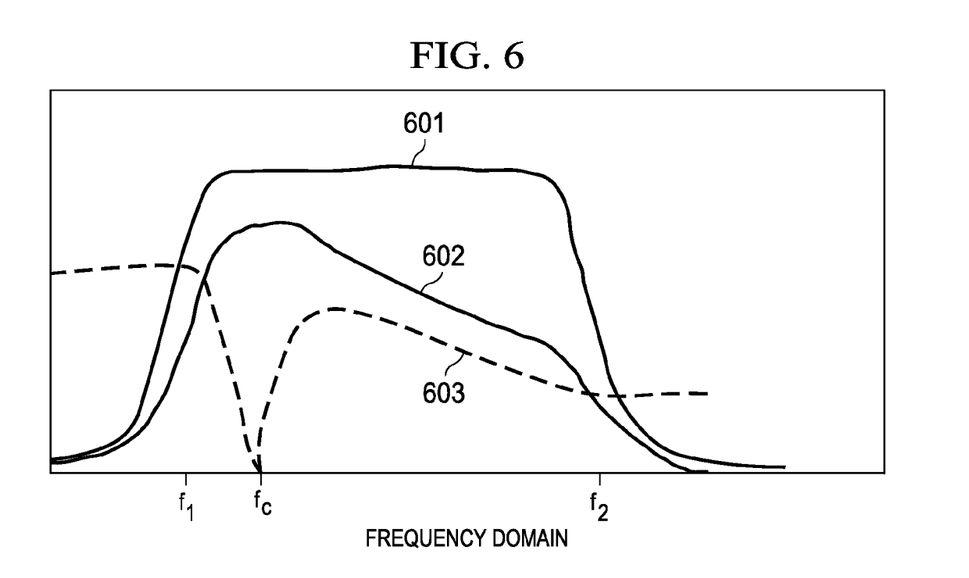
FIG. 6 illustrates a desired frequency response for a chirp-frequency test system.

FIG. 6 illustrates a desired frequency response 601 for a chirp-frequency test system, such as system 200 (FIG. 2). Frequency response 601 provides a level test signal across the test frequency band between frequencies $f_1$ and $f_2$. However, a real-world test system is likely to have a response that is not level in the test frequency band. Frequency response 602 illustrates a less-than-ideal frequency response for a chirp-frequency test system. If the test signal has a non-ideal frequency response, such as response 602, then the measured frequency response of the system under test will include any deviations in the test signal 602. For example, frequency response 603 represents the measured frequency response for a system under test measured using an input signal with frequency response 602. Ideally, the system under test measurements should be similar to response 501 (FIG. 5), but the frequency response of the input signal 602 causes measured response 603 to deviate from actual response 501. This error can be addressed using calibration path 204. The frequency response 602 of the chirp-frequency test system can be first measured through the calibration path. Then, the frequency response 603 of the system under test is measured. By dividing frequency response 603 by the calibration frequency response 602, the actual frequency response 501 of the system under test can be determined.

The FFT operation performed by fast fourier transform circuit 207 (FIG. 2) may be improved using a windowing function that reduces ringing and discontinuity in the time domain. Windowing function w(t) is part of Equation 1 above, which defines the chirp frequency input signal s(t). A windowing function, such as the Tukey window function, may be used to taper the front or tail of the test signal. The Tukey window function is shown in Equation 3. Other windowing functions may also be used.

$$w(t) = \begin{cases} p + (1-p)\sin^2\left(\frac{\pi}{2}\frac{t}{T_W}\right) & \text{for } 0 \le t \le T_W \\ 1 & \text{for } T_W \le t \le T - T_W \\ p + (1-p)\sin^2\left(\frac{\pi}{2}\frac{t-(T-T_W)}{T_W}\right) & \text{for } T - T_W \le t \le T \end{cases} \quad \text{Eq. 3}$$

where:
$T_w$=window taper size
$0 \le p \le 1$, use 0 in most cases

Chirp generator 201 (FIG. 2) may include window function circuit 210, which tapers the chirp frequency signal. Alternatively, the chirp signal frequency may be created by generator 201 in a manner that includes tapering.

Figure 7:
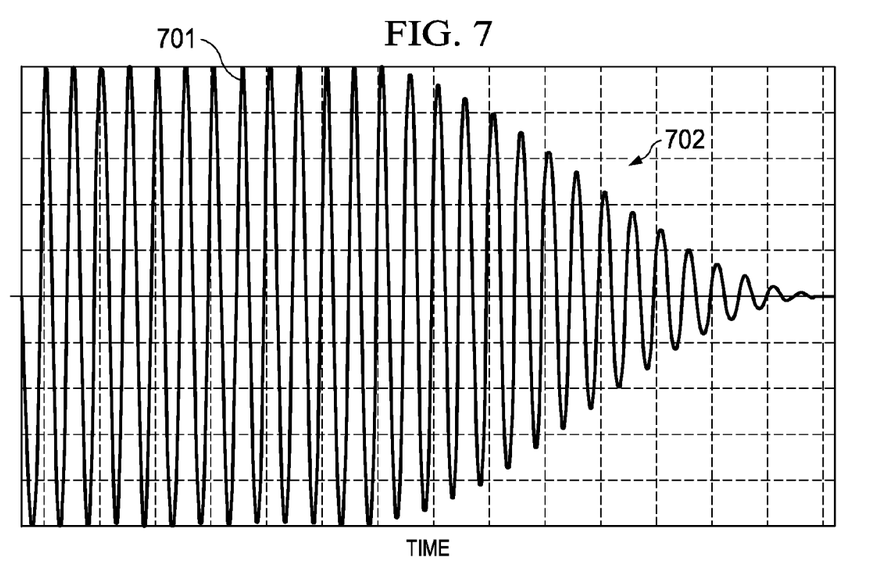
FIG. 7 illustrates a test signal that has been tapered with a windowing function.
Figure 8:
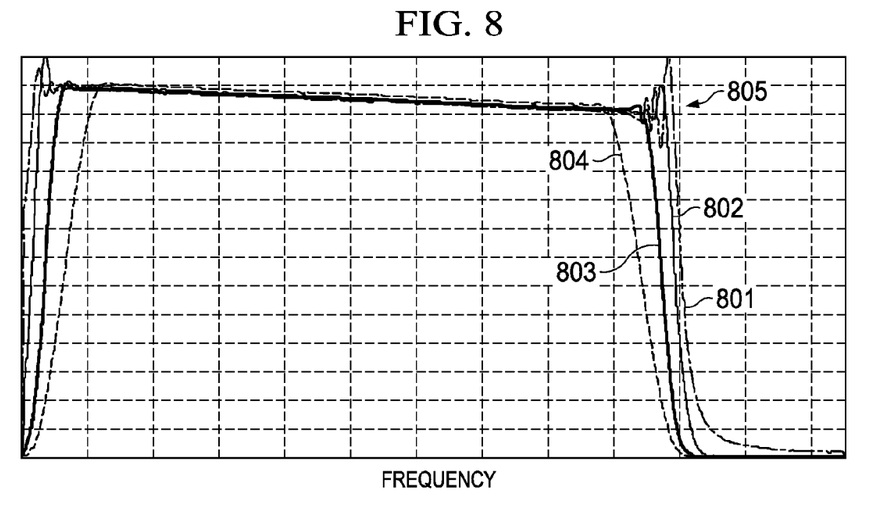
FIG. 8 illustrates the effect of tapering in the time domain on the frequency response.

FIG. 7 illustrates a test signal 701 that has been tapered in the tail 702. FIG. 8 illustrates the effect that tapering in the time domain has on the frequency response for various taper sizes. Frequency curves 801-804 illustrate progressive more tapering of the input signal. Curve 801 has no tapering and shows ringing 805 that is caused by discontinuities in the swept input signal. As the taper size is increased, the ringing 805 can be reduced (curves 802 and 803) or eliminated (curve 804). A side effect of the tapering is the narrowing of the test signal frequency range as illustrated in curves 801-804.

Figure 9A:
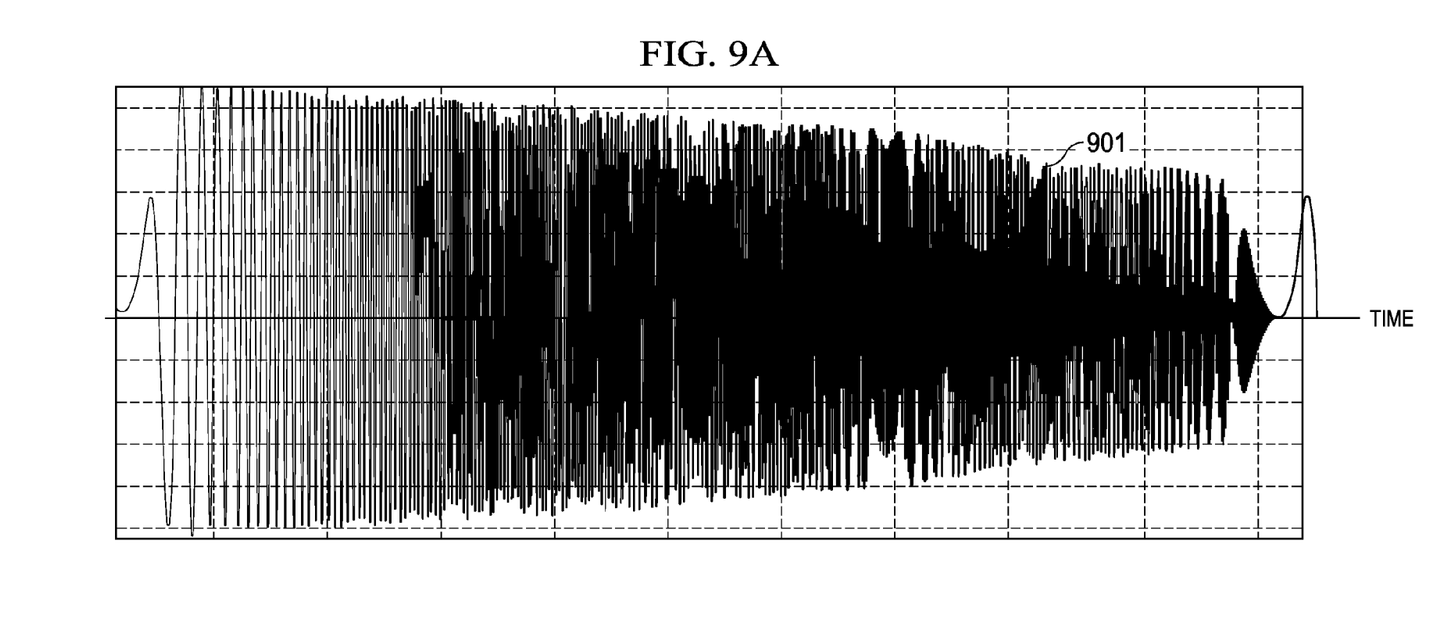
FIG. 9A illustrates a test waveform in the time domain after passing through a calibration path.
Figure 9B:
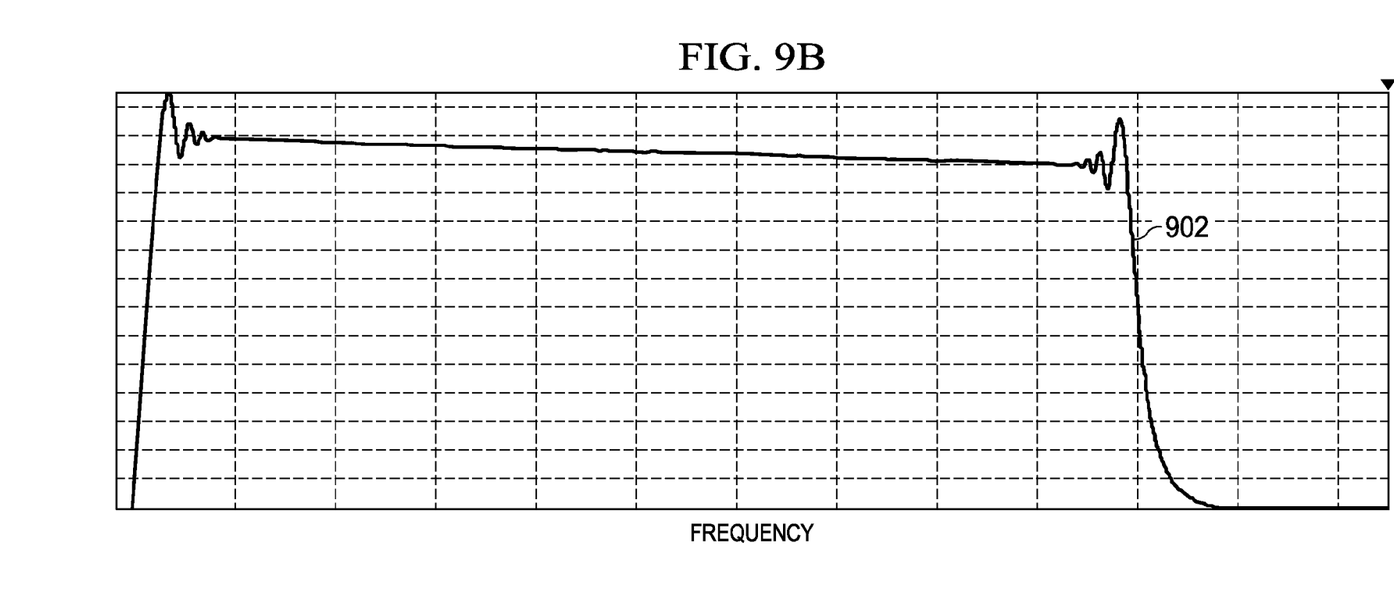
FIG. 9B illustrates FFT data derived from the calibration measurement shown in FIG. 9A.

FIGS. 9A/B and 10A/B illustrate waveforms captured in an exemplary embodiment of the invention using a low pass filter (LPF) as the system under test. FIG. 9A illustrates the test waveform 901 in the time domain after passing through the calibration path. The test waveform 901 has been tapered at the front and tail ends. FIG. 9B illustrates the FFT data 902 derived from calibration measurement 901. Calibration frequency response 902 illustrates loss at the higher frequencies due to the frequency response of the test system.

Figure 10A:
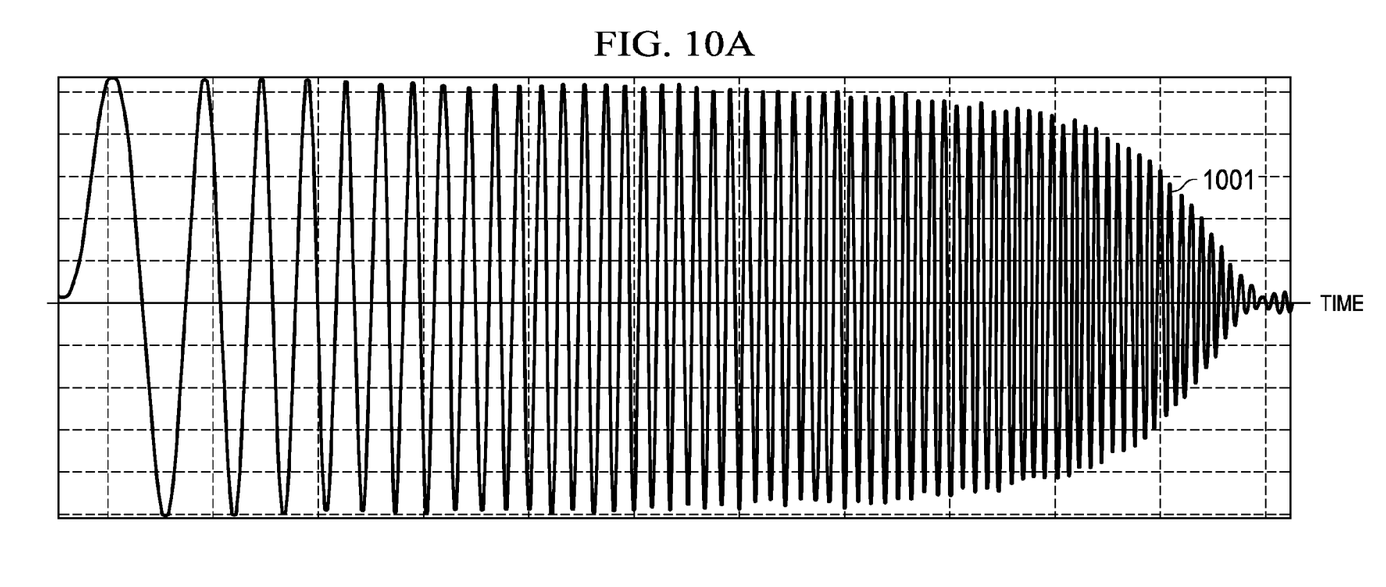
FIG. 10A illustrates a test waveform in the time domain after passing through a system under test.
Figure 10B:
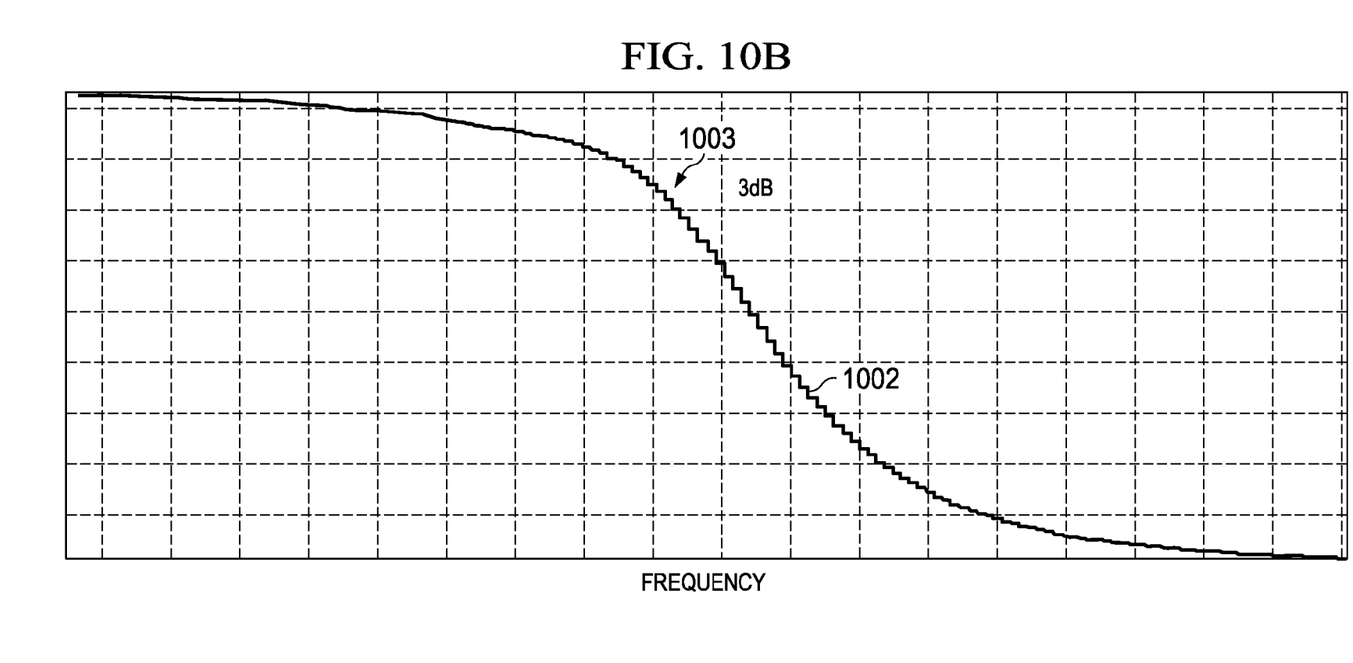
FIG. 10B illustrates the normalized FFT data 1002 derived from the measurement data shown in FIG. 10A.

FIG. 10A illustrates the test waveform 1001 in the time domain after passing through the system under test. FIG. 10B illustrates the normalized FFT data 1002 derived from measurement data 1001. FFT data 1002 has been normalized by dividing by calibration data 902 (FIG. 9B). Embodiments of the present invention provide for the capture of continuous frequency response data 1002, which allow for precise identification of points of interest, such as 3 db point 1003, which designates the edge of the pass band for the LPF under test.

As shown in the examples above, the present invention provides a fast and versatile band width test method for filters, amplifiers, or other systems under test. The invention may be implemented in software and is suitable to most existing test board without requiring changes to test hardware. The system disclosed herein further provides cost savings by reducing the test time and improving the accuracy of the measured system response. The window function can be tuned and the start/end frequencies ($f_1$, $f_2$) may be selected to optimize the sweep signal to provide the best results from the test system.

Figure 11:
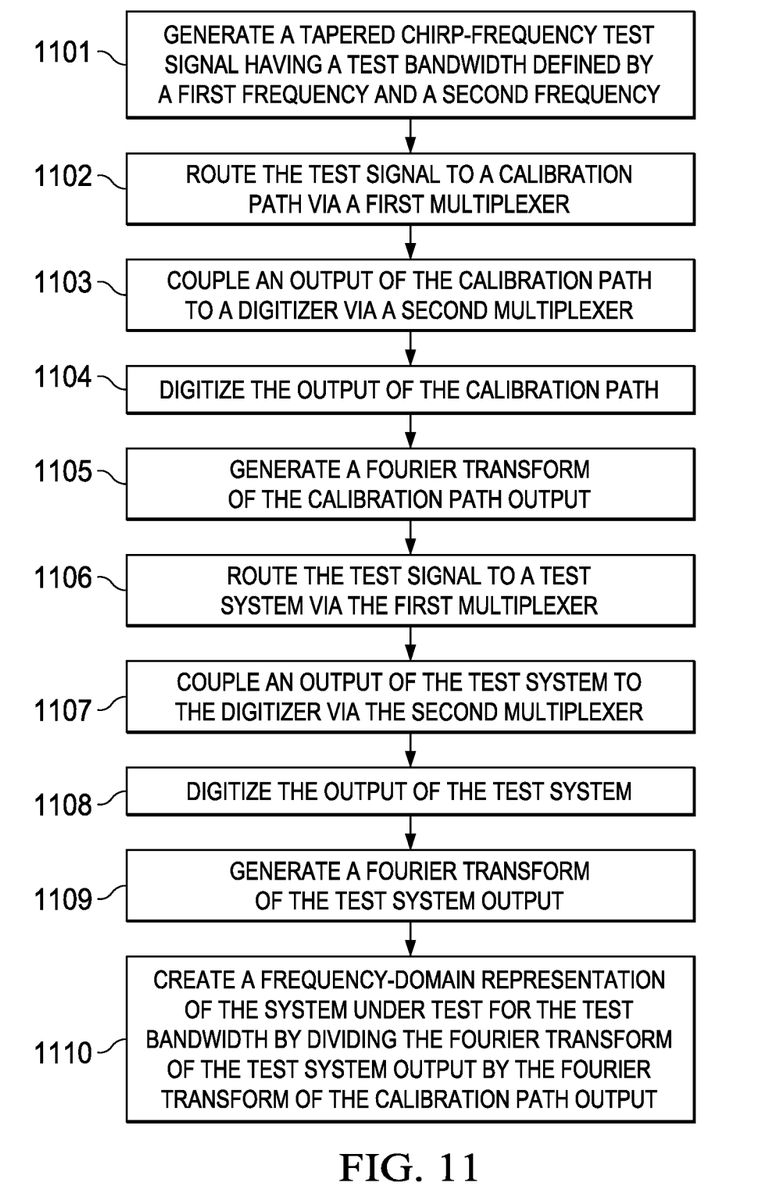
FIG. 11 is a flowchart illustrating an exemplary method for implementing the chirp frequency test system.

FIG. 11 is a flowchart illustrating an exemplary method for implementing the chirp frequency test system disclosed herein. In step 1101, a tapered chirp-frequency test signal is created with a test bandwidth defined by a first frequency and a second frequency. The test signal is routed to a calibration path via a first multiplexer in step 1102. The output of the calibration path is coupled to a digitizer via a second multiplexer in step 1103. In step 1104, the output of the calibration path is digitized and then, in step 1105, a Fourier transform of the calibration path output is generated. The test signal is then routed to a test system via the first multiplexer in step 1106. The output of the test system is coupled to the digitizer via the second multiplexer in step 1107. In step 1108, the output of the test system is digitized and, in step 1109, a Fourier transform of the test system output is generated. A frequency-domain representation of the system under test is created for the test bandwidth by dividing the Fourier transform of the test system output by the Fourier transform of the calibration path output in step 1110.

Many modifications and other embodiments of the invention will come to mind to one skilled in the art to which this invention pertains having the benefit of the teachings presented in the foregoing descriptions, and the associated drawings. Therefore, it is to be understood that the invention is not to be limited to the specific embodiments disclosed. Although specific terms are employed herein, they are used in a generic and descriptive sense only and not for purposes of limitation.

What is claimed is:

1. A system, comprising:
   a waveform generator adapted to produce a chirp frequency signal having a continuous change over a defined range;
   a multiplexer coupled to an output of the chirp frequency generator, the multiplexer selectively routing the chirp frequency signal to a system under test or to a calibration path;
   a digitizer receiving an output from the system under test or an output from the calibration path, the digitizer configured to create data points either from the system under test or from the calibration path; and
   a fast Fourier transform circuit adapted to receive the data points from the digitizer and to compute the discrete Fourier transform for the data points.

2. The system of claim 1, wherein the waveform generator further comprises:
   a windowing circuit adapted to taper the chirp frequency signal.

3. The system of claim 1, wherein the fast Fourier transform circuit further operates to store calibration data points captured over a designated frequency range from a signal routed through the calibration path.

4. The system of claim 3, wherein the fast Fourier transform circuit further operates to create normalized test measurement data by dividing data points captured over the designated frequency range from a signal routed through the system under test by the calibration data points.

5. The system of claim 1, further comprising:
   a second multiplexer coupling the system under test and the calibration path to the digitizer.

6. The system of claim 1, further comprising:
   a memory coupled to an output of the fast Fourier transform circuit, the memory storing calibration data points and normalized test measurement data.

7. The system of claim 1, further comprising:
   a display coupled to an output of the fast Fourier transform circuit, the display presenting calibration data points or normalized test measurement data or both to a user.

8. The system of claim 1, wherein a frequency-domain representation of the system under test is created for a test bandwidth by dividing the Fourier transform of the test system output by the Fourier transform of the calibration path output.

9. A method, comprising:
   generating a chirp frequency signal which undergoes a continuous change over a defined range from a low frequency to a high frequency using a waveform generator;
   selectively routing the chirp frequency signal to a calibration path or to a system under test;
   digitizing an output signal from the calibration path to create calibration data;
   generating a Fourier transform of the calibration data to create a frequency-domain calibration data;
   digitizing an output signal from the system under test to create measurement data;
   generating a Fourier transform of the measurement data to create a frequency-domain measurement data; and
   creating normalized measurement data by dividing the frequency-domain measurement data by the frequency-domain calibration data.

10. The method of claim 9, further comprising:
    tapering the chirp frequency signal using a windowing function prior to the calibration path or the system under test.

11. The method of claim 10, wherein the chirp frequency signal is tapered at a leading end or at a trailing end or at both.

12. The method of claim 9, further comprising:
    storing the calibration data and the measurement data in a memory.

13. The method of claim 9, further comprising:
    storing the normalized measurement data in a memory.

14. The method of claim 9, further comprising:
    displaying the normalized measurement data to a user.

15. The method of claim 9, further comprising:
    displaying the calibration data and the measurement data to a user.

16. The method of claim 9, wherein the chirp frequency signal is selectively routed to a calibration path or to a system under test using a multiplexer.

17. The method of claim 9, further comprising:
coupling an output of the calibration path and an output of the system under test to a using a multiplexer.

18. The method of claim 8, wherein a frequency-domain representation of the system under test is created for a test bandwidth by dividing the Fourier transform of the test system output by the Fourier transform of the calibration path output.

19. A method, comprising:
creating a tapered chirp-frequency test signal having a bandwidth defined by a first frequency and a second frequency, wherein the signal undergoes a continuous change over a defined range from a low frequency or a high frequency;
routing the test signal to a calibration path via a first multiplexer;
coupling an output of the calibration path to a digitizer via a second multiplexer;
digitizing the output of the calibration path;
generating a Fourier transform of the calibration path output;
routing the test signal to a test system via the first multiplexer;
coupling an output of the test system to the digitizer via the second multiplexer;
digitizing the output of the test system;
generating a Fourier transform of the test system output; and
creating a frequency-domain representation of the test system for the bandwidth by dividing the Fourier transform of the test system output by the Fourier transform of the calibration path output.

20. The method of claim 19, further comprising:
tapering the tapered chirp-frequency test signal using a Tukey windowing function.

21. The method of claim 20, further comprising:
storing the frequency-domain representation of the test system in a memory.

22. The method of claim 17, wherein a frequency-domain representation of the system under test is created for the test bandwidth by dividing the Fourier transform of the test system output by the Fourier transform of the calibration path output.

* * * * *